(12) United States Patent
Fukumoto et al.

(10) Patent No.: US 6,688,892 B2
(45) Date of Patent: Feb. 10, 2004

(54) CLIP-TYPE LEAD FRAME FOR ELECTRICALLY CONNECTING TWO SUBSTRATES OR DEVICES

(75) Inventors: Takakazu Fukumoto, Tokyo (JP); Hajime Maeda, Tokyo (JP); Tetsuya Takeoka, Hiroshima (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/201,992

(22) Filed: Jul. 25, 2002

(65) Prior Publication Data

US 2003/0119340 A1 Jun. 26, 2003

(30) Foreign Application Priority Data

Dec. 26, 2001 (JP) ..................... P2001-394686

(51) Int. Cl.⁷ ............................... H01R 12/00
(52) U.S. Cl. ................... 439/65; 439/834; 439/862
(58) Field of Search ................... 439/65, 68, 69, 439/74, 67, 171, 174, 175, 265, 260, 789, 834, 835, 836, 837, 861, 862, 863

(56) References Cited

U.S. PATENT DOCUMENTS

| | | | | |
|---|---|---|---|---|
| 3,027,440 A | * | 3/1962 | Daly ..................... 200/284 |
| 3,066,367 A | * | 12/1962 | Garman ................. 248/222.11 |
| 3,479,634 A | * | 11/1969 | Pritulsky ................. 439/560 |
| 3,689,684 A | * | 9/1972 | Cox et al. ................. 174/261 |
| 3,764,955 A | * | 10/1973 | Ward ..................... 439/377 |
| 3,790,916 A | * | 2/1974 | Keitel ..................... 439/435 |
| 3,924,918 A | * | 12/1975 | Friend ..................... 439/75 |
| 3,933,405 A | * | 1/1976 | Patterson et al. ............. 439/862 |
| 3,941,442 A | * | 3/1976 | Friend ..................... 439/862 |
| 4,018,496 A | * | 4/1977 | Bilsback ..................... 439/67 |
| 4,025,162 A | * | 5/1977 | Yagi ..................... 349/58 |
| 4,350,403 A | * | 9/1982 | Seytre et al. ............... 439/325 |
| 4,362,353 A | * | 12/1982 | Cobaugh et al. ............. 439/825 |
| 4,384,757 A | * | 5/1983 | Andrews et al. ............. 439/736 |
| 4,555,151 A | * | 11/1985 | Neese et al. ................. 439/82 |
| 4,592,617 A | * | 6/1986 | Seidler ..................... 439/876 |
| 4,647,126 A | * | 3/1987 | Sobota, Jr. ................. 439/74 |
| 5,191,404 A | * | 3/1993 | Wu et al. ................. 257/724 |
| 5,910,885 A | * | 6/1999 | Gulachenski et al. ......... 361/774 |
| 6,163,461 A | * | 12/2000 | Watanabe ................. 361/760 |
| 6,312,263 B1 | * | 11/2001 | Higuchi et al. ............... 439/66 |

FOREIGN PATENT DOCUMENTS

| | | |
|---|---|---|
| JP | 2-8877 | 1/1990 |
| JP | 2-88248 | 7/1990 |
| JP | 5-101854 | 4/1993 |
| JP | 7-230837 | 8/1995 |
| JP | 7-320801 | 12/1995 |
| JP | 9-83132 | 3/1997 |

\* cited by examiner

*Primary Examiner*—Ross Gushi
(74) *Attorney, Agent, or Firm*—McDermott, Will & Emery

(57) ABSTRACT

A subject of the present invention is to provide a clip-type lead frame having flexibility against a board thickness variation caused by not only an uneven product quality but also several different thick type products. To this end, the provided clip-type lead frame has a height adjustable means at lead pins corresponding to upper or/and lower side connection pads of the semiconductor device or the sub-board.

8 Claims, 5 Drawing Sheets

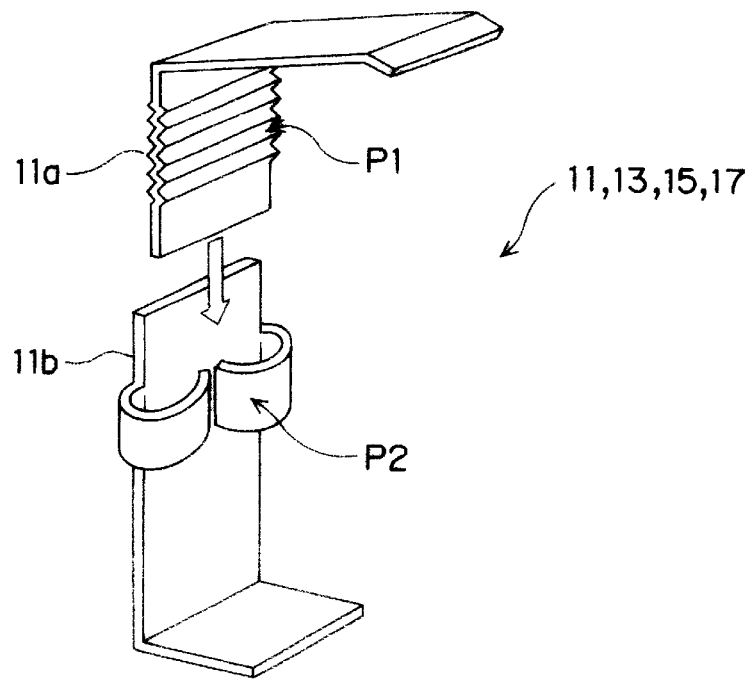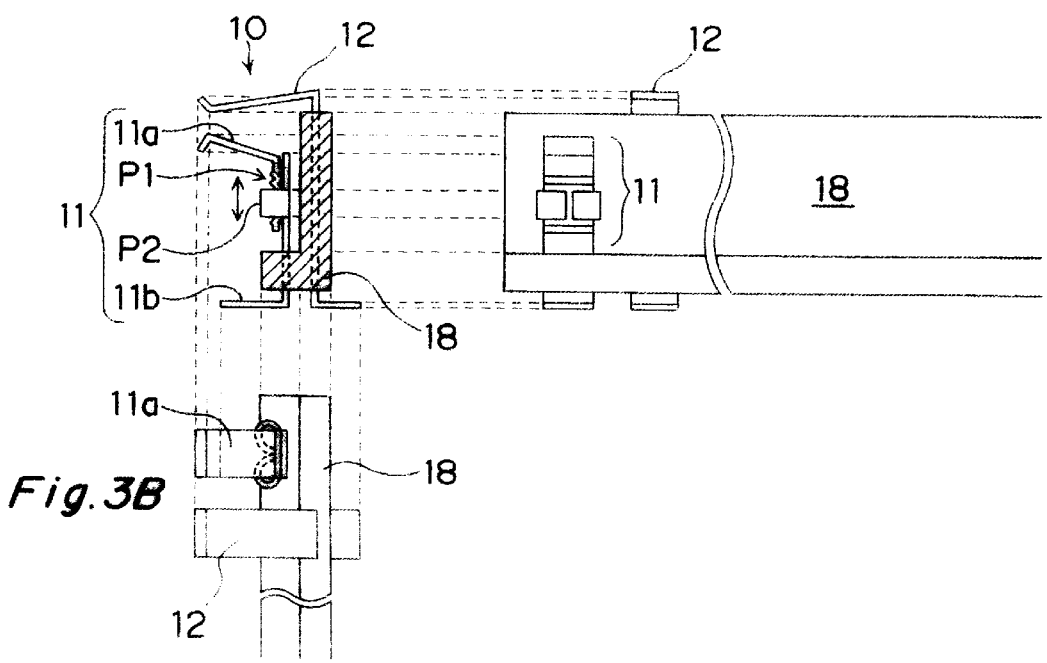

CLIP-TYPE LEAD FRAME FOR ELECTRICALLY CONNECTING TWO SUBSTRATES OR DEVICES

FIELD OF THE INVENTION

The present invention relates to a clip-type lead frame and an electric device with two substrates electrically connected by the lead frame.

BACKGROUND OF THE INVENTION

Conventionally, there have been proposed a number of clip-type lead frames for electrically connecting a main substrate with a sub-substrate or semiconductor device provided on the main substrate. For this purpose, each of the proposed clip-type lead frames has pairs of clip-type lead pins. The paired lead pins are so sized and shaped that they clip and hold the sub-substrate or semiconductor device and, simultaneously, make contacts with corresponding connection pads, if any, provided on a periphery of the sub-substrate or semiconductor device.

For example, a variety of clip-type lead frames have been proposed in Japanese Patent Laid-open Publication Nos. 7-320801, 7-230837, 9-83132 and 5-101854 and Japanese Utility Model Laid-open Publication Nos. 2-8877 and 2-88248. Typically, each of the lead frames proposed in the applications has a specific structure similar to that described in FIG. 9.

Referring to FIG. 9, a memory board 100 or sub-substrate mounted on a main-substrate 200 by means of clip-type lead frames 110 and 120 of the same size and structures. For clarity, electric wires provided on the main-substrate 200 are omitted from the drawing. The memory pad 100 supports connection pads 102, 104 and 106 on a peripheral portion of its upper surface and another connection pads 101, 103, 105 and 107 on the opposite peripheral portion of its lower surface at regular intervals.

As can be seen from the drawing, the clip-type lead frame 110 or 120 has lead pins 121–127 corresponding to connection pads 101–107 provided on the upper and lower peripheral portions of the memory board 100. The lead pins 121, 123, 125 and 127 are provided in places corresponding to the lower connection pads of the memory board 100. The lead pins 122, 124, 126, on the other hand, are provided in places corresponding to the upper connection pads of the memory board 100. A vertical gap between the lower and upper lead pins is determined so that, when once engaged with the memory board 100, they clip and then hold the memory board 100.

However, the vertical gap between the upper and lower pins is fixed, which makes it impossible to apply one lead frame for various semiconductors or sub-substrates having different thicknesses.

SUMMARY OF THE INVENTION

Therefore, a purpose of the present invention is to provide a clip-type lead frame having flexibility to several boards with different thickness caused by not only an uneven product quality but also several different type products.

To this end, a clip-type lead frame for mounting a first substrate with connection pads on its peripheral portion on a second substrate, comprising: a support made of electrically insulative material; and a first pin and a second lead pin made of electrically conductive material and mounted in the support so that an upper portion of first lead pin opposes to an upper portion of the second lead pin with leaving a gap therebetween for clipping and holding the first substrate, wherein at least one of the first and second lead pins has a mechanism for adjusting the gap between the opposing upper portions of the first and second pins.

In another aspect of the present inventions, the upper portions of the first and second lead pin are positioned so that the upper portion of the first lead pin makes a contact with an upper surface of the first substrate and the upper portion of the second lead pin makes a contact with a lower surface of the first substrate, and wherein the adjust mechanism is provided to the first lead pin.

In another aspect of the present inventions, the upper portions of the first and second lead pin are positioned so that the upper portion of the first lead pin makes a contact with an upper surface of the first substrate and the upper portion of the second lead pin makes a contact with a lower surface of the first substrate, and wherein the adjust mechanism is provided to the second lead pin.

In another aspect of the present inventions, the mechanism comprises an upper part of the lead pin, a lower part of the lead pin separated from the upper part of the lead pin, and a holder defined in one of the upper part and the lower part of the lead pin for holding the other of the upper part and the lower part of the lead pin. Also, the remaining part of the of the lead pin has a deformation for preventing a slip between the upper part and the lower part of the lead pin. Preferably, the deformation may be a corrugated portion.

In another aspect of the present inventions, the mechanism has an angled section.

In another aspect of the present inventions, the support has an insulating portion which opposes to a peripheral portion of the first substrate held between the first and second lead pins.

BRIEF DESCRIPTION OF THE DRAWINGS

FIG. 2 is an exploded perspective view of one lead pin of the lead frame;

FIG. 3A is a cross sectional view of the lead frame;

FIG. 3B is a partial side elevational view of the lead frame;

FIG. 3C is a partial top plan view of the lead frame;

DETAILED DESCRIPTION OF THE PREFERRED EMBODIMENTS

Figure 1:
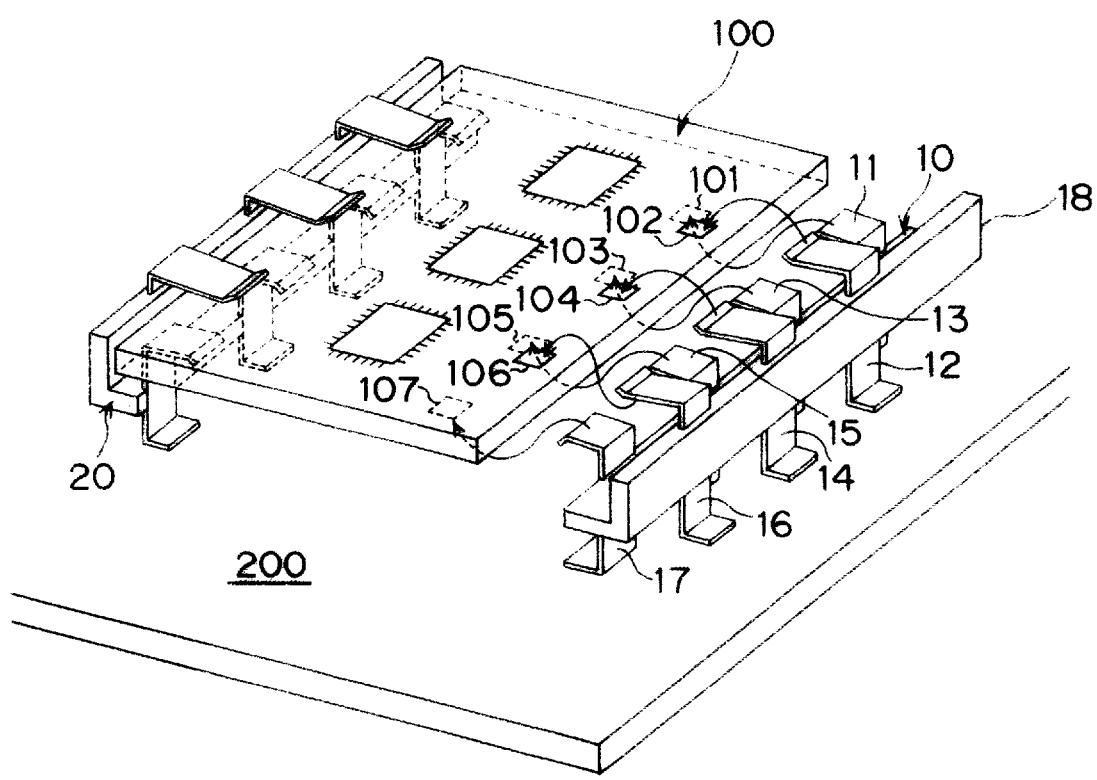
FIG. 1 is a perspective view of a main substrate and a sub-substrate connected by clip-type lead frames according to the first embodiment of the present invention.

With reference to the drawings, several embodiments of the present invention will be described in detail hereinafter. It should be noted that like reference numerals designate like parts throughout the drawings.

First Embodiment

Referring to FIG. 1, there is shown a first substrate 100 mounted on a second substrate 200 by means of clip-type lead frames 10 and 20 of first embodiment according to the present invention. The first substrate 100 and the second substrate 200 may be any electric device such as semiconductor device, a memory device, an electric circuit board, and any combinations thereof. The first substrate 100 has equally spaced connection pads on its opposite peripheral portions, e.g., right and left portions, of upper and lower surfaces. For clarity, only the right connection pads 101–107 are illustrated in the drawing. Likewise, electric wires provided on the second substrate 200 are omitted from the drawing. In this embodiment, although the first substrate 100 is supported at its opposite sides by the lead frames, only one lead frame can be employed if the board has connection pads on one side, for example, left or right side.

In this embodiment, although the clip-type lead frames 10 and 20 are the same size and configuration, they may be different. Each of the clip-type lead frames 10 and 20 has an elongated support 18 made of electrically insulative material such as synthetic resin for supporting a plurality of inner and outer lead pins 11–17 arranged in two lines corresponding to the connection pads 101–107 of the first substrate 100. The inner lead pins 11, 13, 15 and 17, made of electrically conductive material, are provided in a one-to-one correspondence with the connection pads 101, 103, 105 and 107 mounted on the lower surface of the first substrate 100. The outer lead pins 12, 14 and 16, also made of electrically conductive material, are provided in a one-to-one correspondence with the connection pads 102, 104 and 106 mounted on the upper surface of the first substrate 100. Vertical and horizontal gaps between the inner lead pins 11, 13, 15 and 17 and the outer lead pins 12, 14 and 16 are determined so that they cooperate with each other to clip and hold the first substrate 100 in a stable manner.

Referring next to FIG. 2, the inner lead pin 11 as well as other inner lead pins 13, 15 and 17 has an upper part 11a and a lower part 11b. The upper part 11a is bent at its mid portion at an angle greater than 90 degrees to define a vertical portion and a horizontal portion extending from the top end of the vertical portion. The vertical portion of the upper part 11a has a deformation or corrugated section P1 defined therein. Also, the lower part 11b is bent at substantially right angle to define a vertical portion and a horizontal portion. The vertical portion of the lower part 11b has a pair of arms P2 or holder extending from its vertical edges. The arms P2 are curved inwardly so that the curved arms P2 cooperate with the vertical portion of the lower part 11b to hold the vertical portion, in particular corrugated portion P1, of the upper part 11a when it is inserted in a gap defined between the vertical portion and the opposing arms P2 of the lower part 11b. The gap between the vertical portion and the opposing arms P2 of the lower part 11b is defined so that a vertical position of the inserted upper part 11a can be adjusted according to the thickness of the first substrate.

Although the corrugated portion P1 is effective for preventing an unwanted slip of the upper part 11a and thereby positioning the upper part 11a against the lower part 11b, it can be eliminated or it can be replaced by another means capable of preventing any possible slip between the upper and lower parts. Additionally or instead, the vertical portion of the lower part 11b may be formed with the corrugated portion or provided with another similar means for the positioning of the upper part 11a against the lower part 11b of the lead pin 11. Also, the end portion of the opposing arms P2 may be roughed.

Referring to FIGS. 3A to 3C, the outer lead pin 12 as well as other lead pins 14 and 16, which is preferably made from a single plate, has a mid portion extending vertically and an upper and a lower portions extending horizontally in the opposite direction. The lower horizontal portion is bent at substantially right angled against the vertical portion while the upper horizontal portion is curved to define an angle of less than 90 degrees with the vertical portion.

The lower parts 11b of the inner lead pins 11 and the outer lead pins 12 are integrally molded in the support 18 so that the lower horizontal portion of the inner and outer lead pins 11,12 are directed outwardly, i.e., in opposite directions. After molding, the upper part 11a of the inner lead pin 11 is combined with the corresponding lower part 11a by inserting the vertical portion of the upper part 11a into the gap defined between the vertical portion and the opposing arms P2 of the lower part 11b.

Although the vertical portion of the lower part 11b is in part molded in the support 18, it may be totally embedded in the support except for the paired arms P2, increasing the rigidity of the lead pin 11.

Also preferably, a portion of the outer lead pin 12 which would oppose the first substrate 100 inserted between the upper and lower horizontal portions of the outer and inner lead pins 11,12 is covered with the resin. This prevents any connection pad and/or wire provided at the peripheral edge from making an unnecessary contact with the lead pin 12.

Further, as best shown in FIG. 3A, preferably distal ends of the upper horizontal portions of the inner and outer lead pins 11,12 are curved upward and downward, respectively, which eases the insertion the first substrate therebetweeen.

After the first substrate 100 is inserted and then held by the lead frames 10 and 20, the connection pads on the first substrate 100 and the corresponding upper horizontal portions on the connection pads are secured by soldering. Preferably, the upper portion 11a and the arms P2 of the lower portion 11b of each inner lead pin is also secured by soldering. Then, the lower horizontal portion of the inner and outer lead pins are placed on the corresponding connection pads on the second substrate 200 and then secured by soldering.

Figure 4:
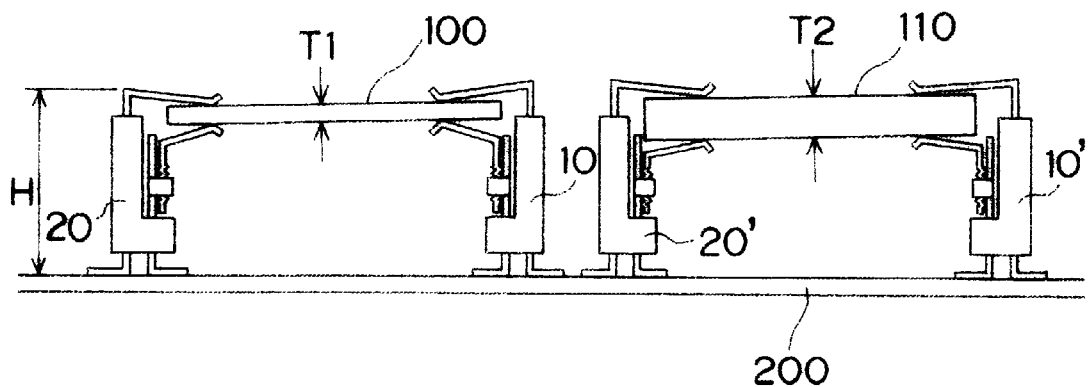
FIG. 4 is a side elevational view of two memory boards mounted on the main-board by means of the clip-type lead frames.

FIG. 4 shows the first substrate 100 and another first substrate 110 having a thickness T2 greater than that Ti of the first substrate 100. In this instance, the thicker first substrate 110 is also supported by the clip-type lead frame 20' which is similar to the lead frame 101 used for supporting the thinner first substrate 100 simply by adjusting the height of the inner lead pin and thereby expanding the vertical gap between the upper horizontal portions of the inner and outer lead pins. Also, the height of the outer lead pin for supporting the upper surface of the first substrates is fixed, such that the height of the upper surface of the thinner first substrate 100 is maintained the same as that of the thicker first substrate 110. This is advantageous for the designing of other substrates or housing provided above the substrate 200.

Figure 5:
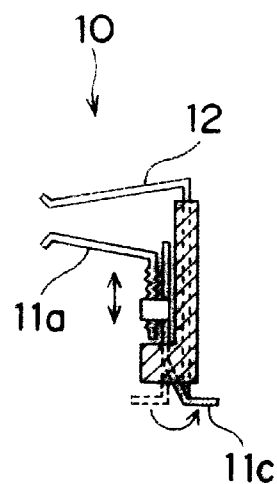
FIG. 5 is a cross sectional view of another embodiment of the clip-type lead frame according to the present invention.

In this embodiment, the lower horizontal portions of the inner and outer lead pins are directed outwardly in opposite orientations. This is effective to prevent the inner lead and the neighboring outer lead from being erroneously connected with each other at soldering. Alternatively, as shown in FIG. 5, the lower horizontal portions of the inner and outer lead pins may be oriented in the same way and away from the first substrate. In this instance, a configuration of a probe for testing the operational features of the first substrate after the board is mounted on the second substrate can be simplified.

Second Embodiment

Figure 6A:
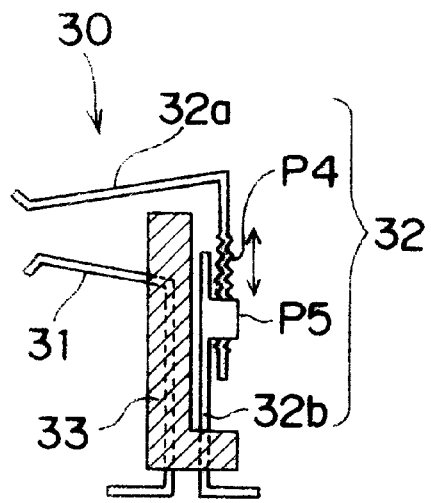
FIGS. 6A to 8B are cross sectional views of another embodiments of the lead frame according to the present invention.

Referring to FIG. 6A, there is shown another lead frame of a second embodiment of the present invention, generally indicated by reference numeral 30. The lead frame 30 has plurality pairs of inner and outer lead pins 31 and 32. The inner pin 31, which is made from a plate, is bent at its upper and lower positions to form upper and lower horizontal portions. Preferably, the upper horizontal portion is oriented obliquely and upwardly while the lower horizontal portion is directed substantially horizontally. Similar to the inner lead frame described in the first embodiment, the outer lead frame 32 is made of two parts, i.e., upper part 32a and lower part 32b. The upper part 32a has a vertical portion which is corrugated in part and a horizontal portion extending horizontally, more preferably extending obliquely and downwardly. The lower part 32b, on the other hand, is substantially right angled. Also, the vertical portion of the lower part 32a has a pair of arms or holders extending from its opposite vertical edges. These arms are curved back so that they cooperate with the vertical portion of the lower part 32b to define a gap into which the vertical portion of the upper part can be inserted and then retained therebetween.

The inner lead pin 31 and the lower part 32b of the outer lead pin 32 are mounted in the insulation support 33 so that the upper and lower horizontal portions of the inner lead pin 31 is oriented outwardly while the lower horizontal portion and the arms of the lower part 32b of the outer lead pin 32 is also directed outwardly. Then, the upper part 32a of the outer lead pin 32 is inserted between the vertical portion and the arms of the lower part 32b of the outer lead pin 32 so that the upper horizontal portion of the upper part 32a is oriented in the same way as the upper horizontal portion of the inner lead pin 31.

Figure 6B:
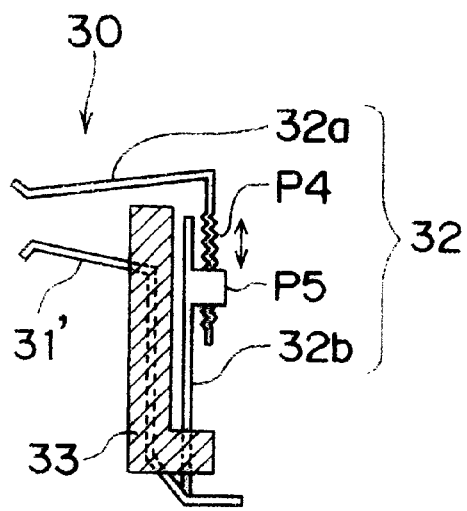

Although the lower horizontal portions of the inner and outer lead pins are directed in the opposite directions, as shown in FIG. 6B them may be oriented in the same direction.

Third Embodiment

Figure 7A:
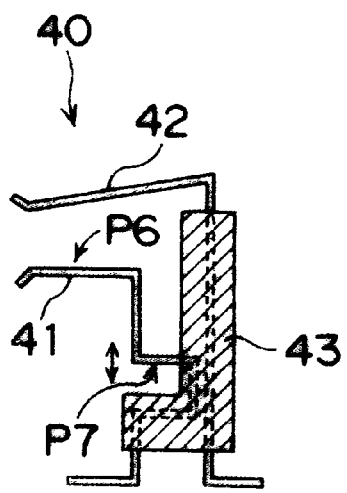
Figure 7B:
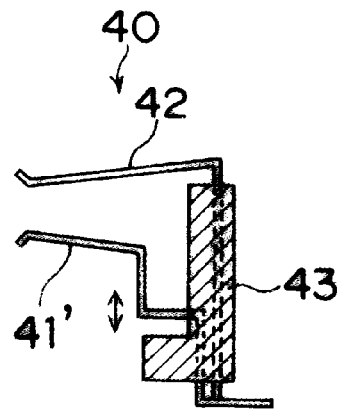

Referring to FIGS. 7A and 7B, there is shown another lead frame of a third embodiment of the present invention, generally indicated by reference numeral 40. This embodiment is a modification of the first embodiment in which the inner lead 41 is angled in its vertical portion to define a square bracket section having a upper horizontal portion, a lower horizontal portion, and a vertical portion connecting the upper and lower horizontal portions. Also, the inner lead 41 is molded in the support 43 so that the upper horizontal portion indicated by P7 is projected from the support 43. The outer lead pin 42 is the same as that in the first embodiment.

This arrangement allows an increased elastic displacement of the upper horizontal portion P6 of the inner lead pin 41, causing the lead frame to be employed for the clipping and holding of the first substrates having different thicknesses.

It should be noted that the length of the part of the bracket section molded in the support could be changed as required.

Although the inner lead pin 41 is angled in the bracket fashion, it may be angled stepwise as shown the inner lead pin 41' in FIG. 7B.

Also, although the inner lead pin 41 is angled, the outer lead pin 42 may be angled in the manner described above.

Fourth Embodiment

Figure 8A:
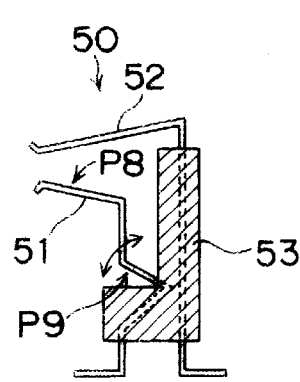
Figure 8B:
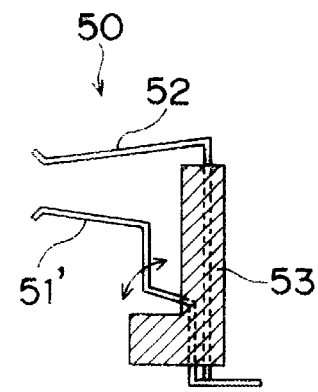
Figure 9:
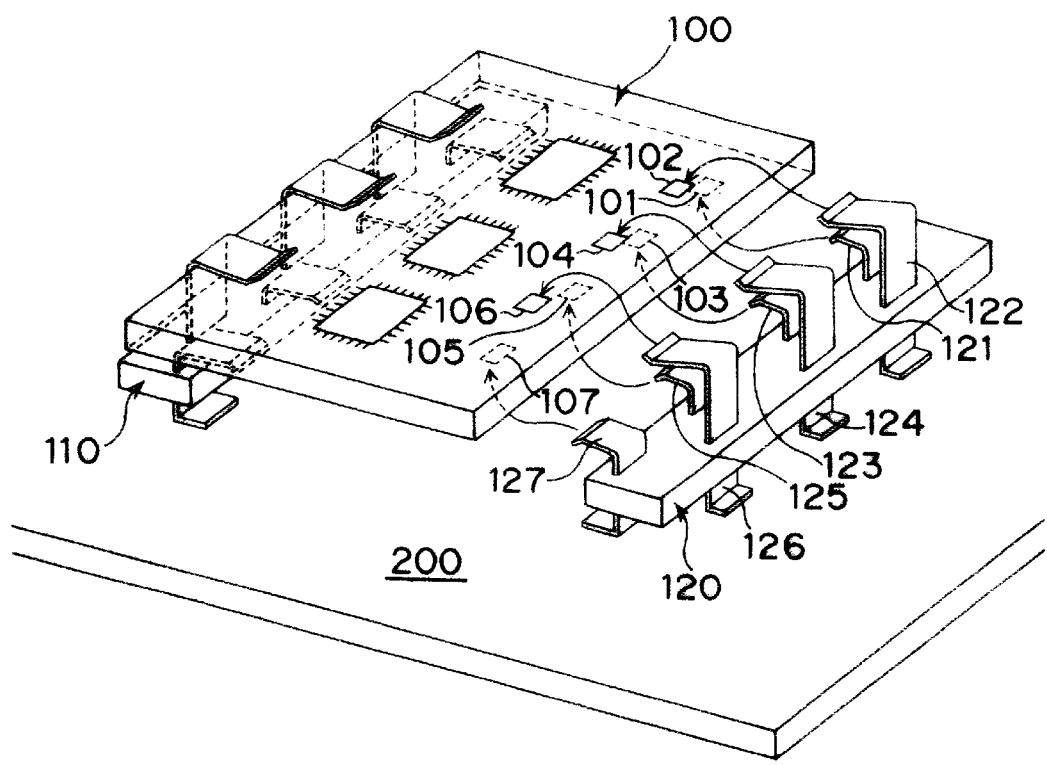
FIG. 9 is a perspective view of the conventional lead frames and the upper and lower substrates connected by the lead frames.

Referring to FIGS. 8A and 8B, there is shown another lead frame of a fourth embodiment of the present invention, generally indicated by reference numeral 50. This embodiment is another modification of the first embodiment in which the inner lead 51 is angled in its vertical portion to define an angled bracket section having an upper oblique portion and a lower oblique portion.

This arrangement also results in the advantages derived from the third embodiment. Namely, the elasticity of the angled lead pin and the displacement of the upper horizontal portion P8 can be changed simply by the length of the portion P9 molded in the support.

Although the inner lead pin 51 is angled in the angled bracket fashion, it may be angled stepwise as shown the inner lead pin 51' in FIG. 8B.

Although the inner lead pin 51 is angled, the outer lead pin 52 may be angled in the manner described above.

Fifth Embodiment

Although in the embodiment described above a mechanism is provided for either inner or outer lead pin for changing the height of its upper horizontal portion, it may be provided to both lead pins. This increases the height adjustment of the upper and lower limits of the first substrate.

It should be noted that the present application is based upon the Japanese Patent Application No. 2001-394686 which is entirely incorporated herein by reference.

What is claimed is:

1. A clip-type lead frame for mounting a first substrate with connection pads on its peripheral portion on a second substrate, comprising:

a support made of electrically insulative material;

a first pin and a second lead pin made of electrically conductive material and mounted in the support so that an upper portion of first lead pin opposes to an upper portion of the second lead pin with leaving a gap therebetween for clipping and holding the first substrate, wherein at least one of the first and second lead pins has a mechanism for adjusting the gap between the opposing upper portions of the first and second pins.

2. The clip-type lead frame in accordance with claim 1, wherein the upper portions of the first and second lead pin are positioned so that the upper portion of the first lead pin makes a contact with an upper surface of the first substrate and the upper portion of the second lead pin makes a contact with a lower surface of the first substrate, and wherein the adjust mechanism is provided to the first lead pin.

3. The clip-type lead frame in accordance with claim 1, wherein the upper portions of the first and second lead pin are positioned so that the upper portion of the first lead pin makes a contact with an upper surface of the first substrate and the upper portion of the second lead pin makes a contact with a lower surface of the first substrate, and wherein the adjust mechanism is provided to the second lead pin.

4. The clip-type lead frame in accordance with claim 1, wherein the mechanism has an angled section.

5. The clip-type lead frame in accordance with claim 1, wherein the support has an insulating portion which opposes to a peripheral portion of the first substrate held between the first and second lead pins.

6. The clip-type lead frame in accordance with claim 1, wherein the mechanism comprises an upper part of the lead pin, a lower part of the lead pin separated from the upper part of the lead pin, and a holder defined in one of the upper part and the lower part of the lead pin for holding the other of the upper part and the lower part of the lead pin.

7. The clip-type lead frame in accordance with claim 6, wherein the remaining part of the of the lead pin has a deformation for preventing a slip between the upper part and the lower part of the lead pin.

8. The clip-type lead frame in accordance with claim 7, wherein the deformation is a corrugated portion.

* * * * *